(12) United States Patent
Tseng

(10) Patent No.: US 7,049,702 B2
(45) Date of Patent: May 23, 2006

(54) DAMASCENE STRUCTURE AT SEMICONDUCTOR SUBSTRATE LEVEL

(75) Inventor: Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 60 days.

(21) Appl. No.: 10/640,757

(22) Filed: Aug. 14, 2003

(65) Prior Publication Data

US 2005/0035460 A1    Feb. 17, 2005

(51) Int. Cl.
*H01L 29/40*   (2006.01)
(52) U.S. Cl. ..................................... 257/774; 257/760
(58) Field of Classification Search ................ 257/774, 257/760, 715; 438/706, 715
See application file for complete search history.

(56) References Cited

U.S. PATENT DOCUMENTS 5,856,226 A * 1/1999 Wu ........................... 438/291
6,211,085 B1   4/2001 Liu ............................ 438/687
6,309,977 B1 * 10/2001 Ting et al. .................. 438/706

FOREIGN PATENT DOCUMENTS

TW            541651         6/1991

* cited by examiner

*Primary Examiner*—Rey Potter
(74) *Attorney, Agent, or Firm*—Thomas, Kayden, Horstemeyer & Risley

(57) ABSTRACT

A damascene structure and process at semiconductor substrate level. A pre-metal dielectric layer is provided on a semiconductor substrate with an opening exposing a contact region on the substrate. A buffer metal layer is provided on the exposed contact region, and a barrier layer is provided on the interior of the opening. A conductor is provided on the buffer metal layer, substantially filling the opening to electrically connect to the contact region.

45 Claims, 3 Drawing Sheets

DAMASCENE STRUCTURE AT SEMICONDUCTOR SUBSTRATE LEVEL

BACKGROUND OF THE INVENTION

1. Field of the Invention

The invention relates to semiconductor manufacturing, and more particularly to a damascene structure and process at a semiconductor substrate level.

2. Description of the Related Art

The application of damascene process continues to gain wider acceptance, most notably in the process of copper metallization due to the difficulty of copper dry etch where the damascene plug penetrates deeply into very small, sub-half micron, Ultra Large Scale integrated devices. Even when the use of copper wiring for multilevel interconnects has been demonstrated by dual damascene, tungsten plugs are exclusively used for contact points at substrate level in order to avoid damage to the devices in spite of the lower electrical conductivity. See for example, U.S. Pat. No. 6,211,085 to Chung-Shi Liu.

The aspect ratios of contact holes are rapidly increasing in recent years as the density of integrated circuits increases. With such increasing aspect ratios of contact holes, however, it is believed that tungsten plugs will no longer be desirable for next generation devices due to the increasing contact resistance at deep and narrow contact holes.

Another issue with tungsten plugs is the risk of contact electromigration failure since a dissimilar material such as aluminum or copper is typically used as the first level metal.

Accordingly, there exists a need in the art for an improved architecture for very fine contact holes at substrate level which can provide higher electrical conductivity and improved electromigration resistance. To this end, copper plugs at semiconductor substrate level are proposed.

SUMMARY OF THE INVENTION

A broad object of the invention is to provide a reliable connect for very fine contact holes at semiconductor substrate level.

Another object of the invention is to provide a damascene structure and process at semiconductor substrate level that provide reduced contact resistance.

A further object of the invention is to provide a damascene structure and process at semiconductor substrate level that provide improved electromigration resistance.

Yet a further object of the invention is to provide a damascene structure and process that can form copper plugs at the substrate level and copper interconnects at the first metal level.

To achieve the above and other objects, various forms of damascene architectures at the substrate level have been developed.

According to an embodiment of the invention, a buffer metal serving as a diffusion barrier against copper atoms is provided between a conduct plug and a contact region, and a dielectric barrier is provided on the sidewalls of a contact hole. The damascene structure includes: a semiconductor substrate with a contact region on the surface; a pre-metal dielectric layer on the semiconductor substrate with an opening exposing the contact region; a buffer metal layer on the exposed contact region; a dielectric barrier layer on the sidewalls of the opening; and a conductor on the buffer metal layer, substantially filling the opening.

According to another embodiment of the invention, a buffer metal is provided and a metal barrier layer formed on the bottom and sidewalls of a contact hole. The damascene structure includes: a semiconductor substrate with a contact region on the surface; a pre-metal dielectric layer on the semiconductor substrate with an opening exposing the contact region; a buffer metal layer on the exposed contact region; a metal barrier layer on the bottom and sidewalls of the opening; and a conductor on the metal barrier layer, substantially filling the opening.

According to a further embodiment of the invention, a metal barrier layer is formed in a contact hole without a buffer metal, and a copper or copper alloy plug fills the contact hole. The damascene structure includes: a semiconductor substrate with a source/drain region of a MOS transistor and a metal silicide formed on the source/drain region; a pre-metal dielectric layer on the semiconductor substrate with a contact hole exposing the metal silicide, the width of the contact hole not exceeding 650 Å; a metal barrier layer on the bottom and sidewalls of the contact hole; and a copper or copper alloy plug on the metal barrier layer, substantially filling the contact hole.

DESCRIPTION OF THE DRAWINGS

For a better understanding of the present invention, reference is made to a detailed description to be read in conjunction with the accompanying drawings, in which.

REFERENCE NUMERALS IN THE DRAWINGS

Figure 1:
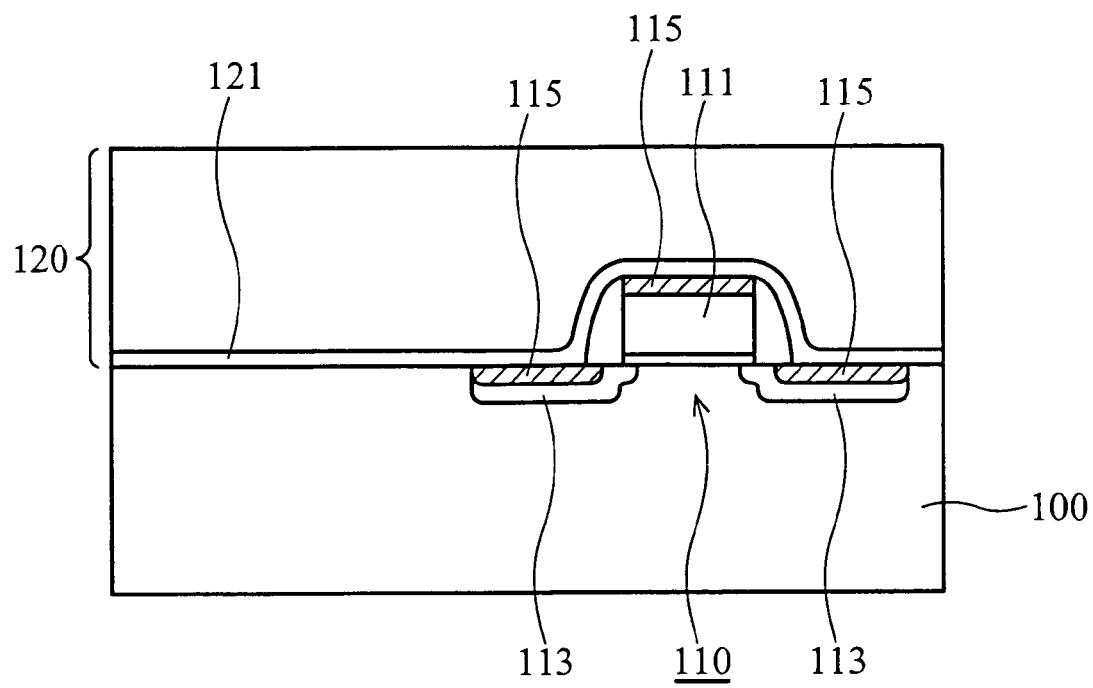
FIGS. 1 to 3 are cross-sections showing a damascene process and structure according to the first embodiment of the invention, in which a buffer metal is provided on a contact region and a dielectric barrier is provided on the sidewalls of a contact hole.

100 semiconductor substrate
110 MOS transistor
111 gate electrode
113 source/drain region
115 metal silicide
120 pre-metal dielectric layer
121 etch stop layer
130 contact hole
140 buffer metal layer
150 dielectric barrier layer
160 conductive plug
170 interconnect trench
180 interconnect
190 metal dielectric layer
200 copper or copper alloy plug

DETAILED DESCRIPTION OF THE INVENTION

The following embodiments illustrate application of the present invention to a damascene process at semiconductor substrate level. For convenience, most of the following embodiments are illustrated by a single damascene process, but are not restricted thereto. Indeed, as will be appreciated by persons skilled in the art, the present invention is also applicable to a dual damascene process.

First Embodiment

A preferred embodiment of the present invention is now described with reference to FIGS. 1 through 3. FIG. 1 shows a semiconductor substrate 100 such as a silicon substrate or silicon-on-insulator substrate (SQI). The substrate 100 is understood to possibly contain isolation structures, capacitors, diodes, and the like, though only a MOS transistor 110 is shown in the drawings for the sake of clarity. The transistor 110 includes a gate electrode 111, and source/drain regions 113. Preferably, metal silicides 113 are formed on the gate electrode 111 and source/drain regions 113 by methods known in the art to reduce the contact resistance. The metal silicides 115 can be titanium silicide, cobalt silicide, or nickel silicide, and preferably have a thickness between about 50 Å and 350 Å.

Still referring to FIG. 1, a pre-metal dielectric (PMD) layer 120 preferably having a planar upper surface is formed overlying the substrate 100 and the MOS transistor 110. The PMD layer 120 may consist of one or more dielectric depositions of silicon-containing or organic-based materials. Preferably, the PMD layer contains a low dielectric constant material with a dielectric constant (k) not exceeding 3.5. Suitable silicon-containing materials for the PMD layer 120 include but are not limited to silicon carbide, silicon oxide, silicon nitride, silicon oxynitride, silicon-rich oxide, silicon-rich oxynitride, carbon-doped silicon oxide, carbon-doped silicon nitride, carbon/nitrogen-doped silicon oxide (SiONC), or combinations thereof. Suitable organic-based materials include but are not limited to spin-on-polymer (SOP) dielectric materials such as polyimide organic polymer, polyarylene ether organic polymer, parylene organic polymer and fluorinated analogs thereof. Other low k dielectric materials suitable for use herein include: spin-on-glass (SOG) dielectric materials such as hydrogen silsesquioxane, carbon bonded hydrocarbon silsesquioxane, and carbon bonded fluorocarbon silsesquioxane; amorphous carbon dielectric materials such as amorphous carbon, hydrogenated amorphous carbon and fluorinated amorphous carbon; diamond-like carbon dielectric materials such as diamond-like carbon, hydrogenated diamond-like carbon and fluorinated diamond-like carbon; fluorosilicate glass (FSG) dielectric materials; and aerogel microporous dielectric materials.

As shown in FIG. 1, the PMD layer 120 preferably includes a substantially conformal etch stop layer 121 lining the substrate surface and the MOS transistor 110. The etch stop layer 121 is preferably a silicon oxynitride or silicon-rich oxynitride layer formed by plasma-enhanced chemical vapor deposition (PE-CVD) using Ar as carrier gas. Alternatively, the etch stop layer may be a bi-layer etch stop layer consisting of stacked SiON/SiN or SiN/SiON, where the SiON acts as actual etch stop while the SiN acts as a stress adjusting layer.

Figure 2:
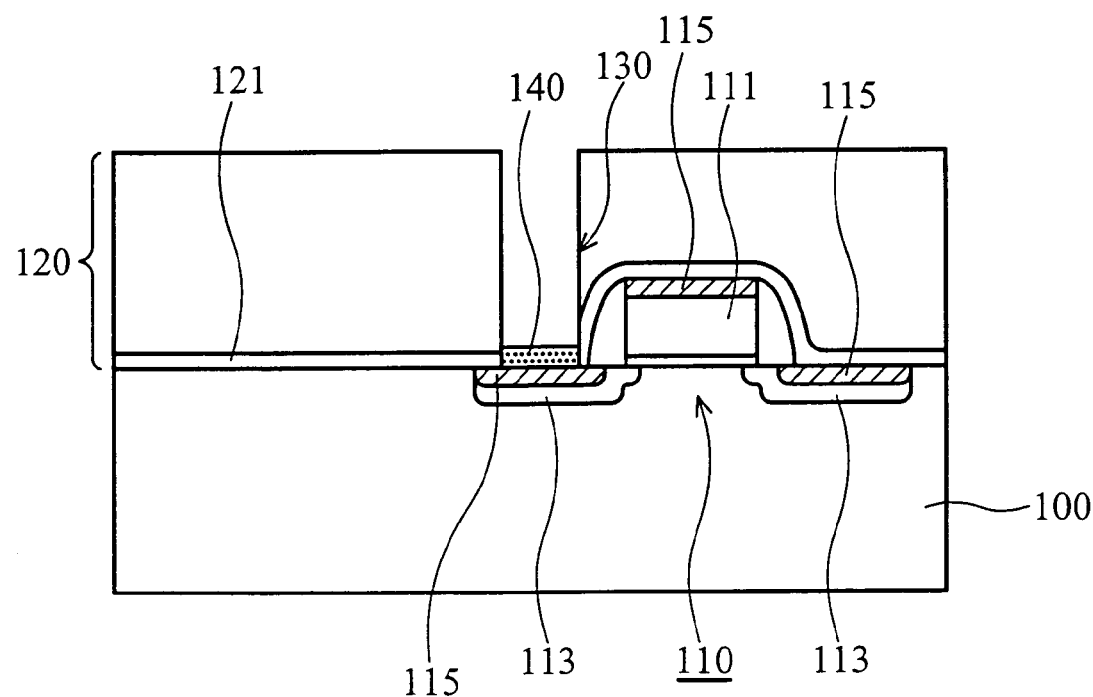

Referring to FIG. 2, a contact hole 130 is defined through the PMD layer 120 using known lithography technology and etching methods to expose a contact region on the substrate. When etching the contact hole 130, the etch stop layer 121 avoids damage to the underlying device. It should be noted that while in FIG. 2, the contact hole 130 is etched to expose the source/drain region 113 as a contact region, it is to be understood that the contact region can be the gate electrode 111 of the MOS transistor 110. Although the aspect ratio of the contact hole 130 can vary depending on the design rule, the present invention is particularly suitable for those not less than 5. Typically and preferably, the contact hole 130 has a width not exceeding 650 Å, a depth not exceeding 5000 Å.

Still referring to FIG. 2, a buffer metal layer 140 is formed on the metal silicide 115 of the source/drain region 113. The buffer metal layer 140 can serve as an effective diffusion barrier to prevent the diffusion of plug materials, such as copper, into the underlying devices, thus providing a reliable contact. The thickness of the buffer metal layer is preferably less than ⅕ of the contact hole depth, and more preferably less than 1/10 of the contact hole depth. Typically the buffer metal layer 140 has a thickness about 100–500 Å. The buffer metal is preferably a refractory metal such as tantalum, titanium, tantalum nitride, titanium nitride, tungsten, tungsten nitride, or combinations thereof, and is preferably polycrystalline but can be amorphous.

The buffer metal 140 can be selectively grown on the silicide 115 by a selective epitaxial growth process at the contact hole 130. Alternatively, the buffer metal 140 can be formed by blanket deposition of a metal layer followed by etch back. For example, a refractory metal can be deposited on the entire surface to completely fill the contact hole 130 by use of the CVD (Chemical Vapor Deposition) or PVD (Physical Vapor Deposition) method. Then the metal is recessed by etch back to a predetermined thickness in the contact hole 130. In addition, the buffer metal can be formed by directional sputtering.

Figure 3:
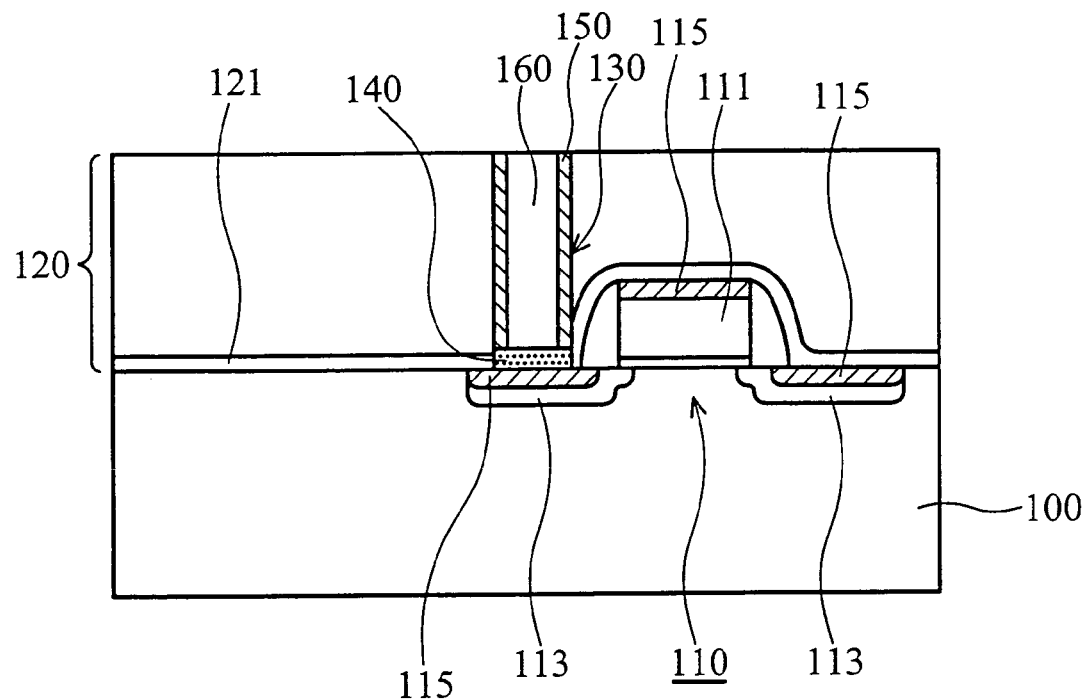

Referring to FIG. 3, a dielectric barrier layer 150 is formed on the sidewalls of the contact hole 130. It can be formed by depositing a substantially conformal dielectric layer over the entire substrate surface followed by anisotropic etch back until the buffer metal layer 140 is exposed. The dielectric barrier layer preferably has a width of about 30–300 Å and is preferably a silicon-containing layer such as silicon oxide, silicon nitride, carbon-doped silicon oxide, carbon-doped silicon nitride, carbon/nitride doped silicon oxide, silicon carbide, or combinations thereof. Typically and preferably, the dielectric barrier layer can be deposited by CVD, which assures good step coverage over high aspect ratio contact holes.

Still referring to FIG. 3, thereafter, a conductive plug 160 is formed substantially filling the contact hole 130 to electrically connect to the contact region 113. As used in the present invention, the term "substantially filling" means at least 70% space of an opening, e.g., a contact hole, is filled (by a conductor). The conductive plug 160 can be formed of materials including but not limited to metal, metal compound, metal alloy, doped polysilicon, polycides, although copper and copper alloys are particularly preferred. It can be formed by overfilling the contact hole and removing the conductive material outside of the contact hole by etch back or chemical mechanical polishing (CMP). The deposition of copper can be accomplished by chemical vapor deposition (CVD), physical vapor deposition (PVD), or electrochemical deposition (ECD). For example, it may be formed by first depositing a seed layer of 300–1500 Å thickness by ionized metal plasma (IMP), followed by electrochemical deposition to grow copper on the seed layer. Following this, an annealing process at 150–400° C. can be performed to reduce the resistivity of the copper plug.

As shown in FIG. 3, the damascene structure of this embodiment features a buffer metal layer 140 between the contact region 113 and the conductive plug 160 to prevent inter-diffusion therebetween, thus making copper plugs high suitable for use at the substrate level to reduce the contact resistance and improve the electromigration resistance.

Second Embodiment

Figure 4:
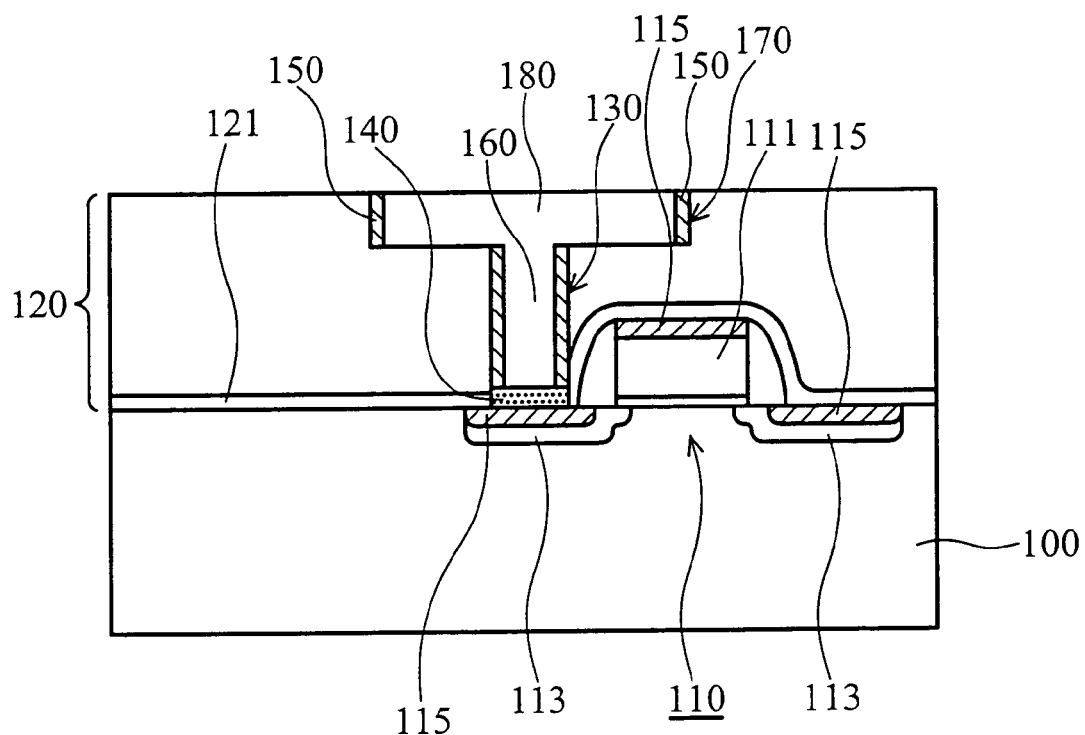
FIG. 4 is a cross-section showing a damascene structure according to the second embodiment of the invention, in which a dual damascene structure is formed.

FIG. 4 shows another embodiment of the invention, in which a dual damascene opening including the contact hole 130 and the interconnect trench 170 are defined in the PMD layer 120 by methods known in the art. Then a buffer metal 140 is formed on the contact region 113, and a dielectric barrier layer 150 is formed on the sidewalls of the interconnect trench 170 as well as on that of the contact hole 130 by performing similar processes as in the first embodiment. Finally, the contact hole 130 and the interconnect trench 170 are filled with the same conductor to form the substrate level contact plug 160 and the first level interconnect 180 at the same time. Consequently, the risk of contact electromigration due to a dissimilar material used in the substrate level contact hole can be reduced. In particular, copper or copper alloys can be used herein to reduce the contact resistance and to further improve the electromigration resistance, which in turn allows the use of higher current and improves the circuit speed.

Third Embodiment

Figure 5:
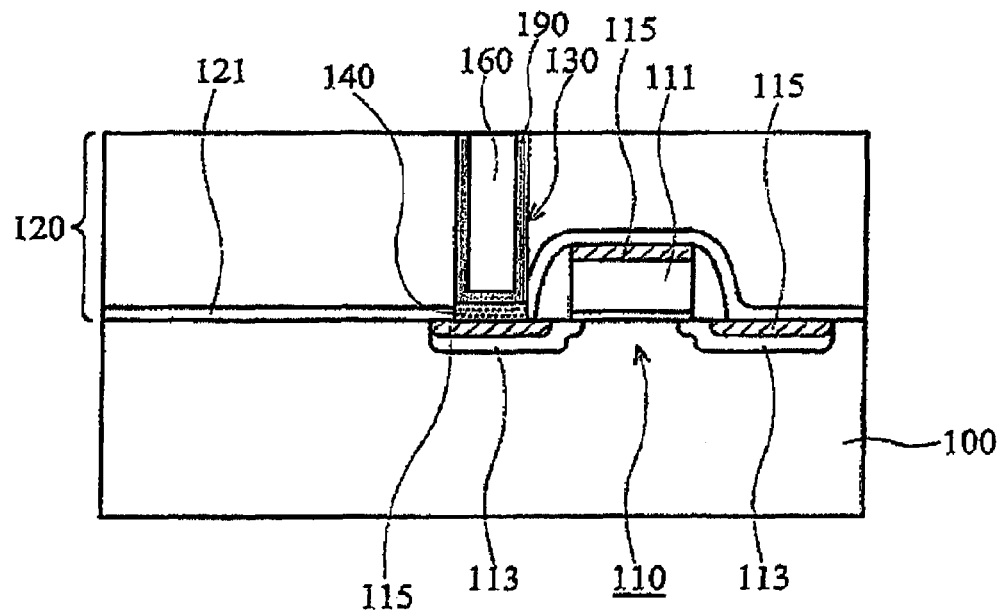
FIG. 5 is a cross-section showing a damascene structure according to the third embodiment of the invention, in which a buffer metal is provided on a contact region and a metal barrier is provided on the bottom and sidewalls of a contact hole.

FIG. 5 illustrates a further embodiment of the invention using a buffer metal in the substrate level contact hole. In this embodiment, rather than forming a dielectric barrier layer, a metal barrier layer 190 is provided on the bottom and sidewalls of the contact hole 130. Namely, after the buffer metal 140 is formed on the contact region 113 as in the first embodiment, a metal barrier layer 190 such as tantalum, titanium, tungsten, tantalum nitride, titanium nitride, or tungsten nitride is deposited on the entire surface to such a thickness as not to completely fill the contact hole 130, and then a conductive material 160 is formed on the barrier metal to substantially fill the contact hole 130. Thereafter, the metal barrier layer 190 and the conductive material 160 are etched back or polished by use of the CMP method until the PMD layer 120 is exposed and thus the surface of the structure is made flat and a contact plug is formed.

The metal barrier layer 190 may be an amorphous metal or polycrystalline metal, and a nitrogen-containing metal such as tantalum nitride, titanium nitride, or tungsten nitride is particularly preferred. It can be deposited by chemical vapor deposition (CVD) or by physical vapor deposition (PVD), and preferably deposited to a thickness between about 110 and 150 Å. When the metal barrier layer is formed by CVD, a thermal annealing process is performed at about 200–500° C. under hydrogen-containing ambient to densify and remove impurities from the deposited film. More preferably, the metal barrier layer is a dual-layer CVD film. For example, after a first CVD TiN film is deposited and annealed, a second CVD TiN film is deposited overlying the first TiN film.

Fourth Embodiment

Figure 6:
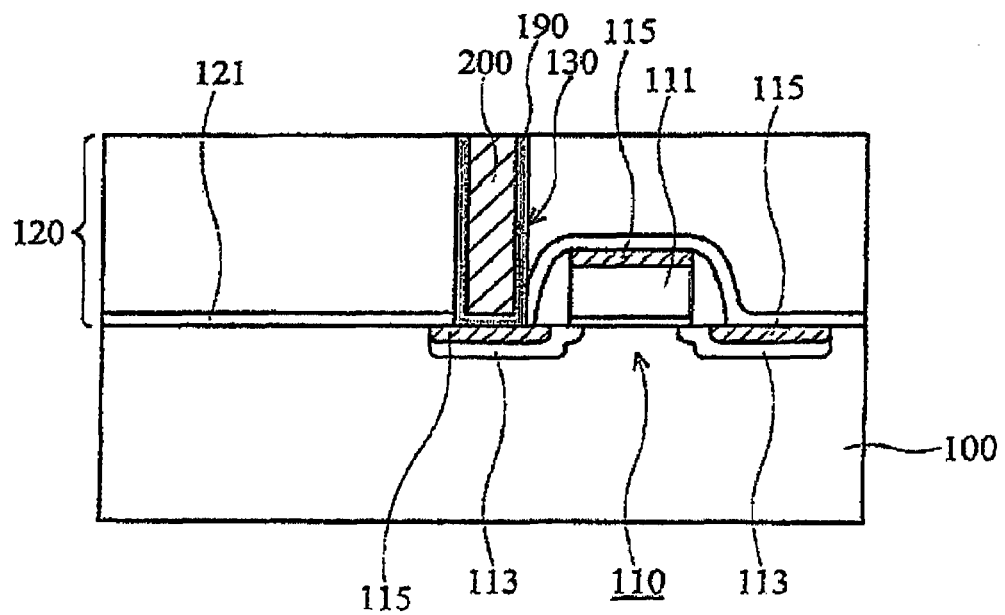
FIG. 6 is a cross-section showing a damascene structure according to the fourth embodiment of the invention, in which a metal barrier is directly on a contact region without a buffer metal and a copper or copper alloy plug is formed.

FIG. 6 illustrates yet a further embodiment of the invention. In this embodiment, a metal barrier is deposited directly on the contact region without forming the buffer metal. After the contact hole 130 is defined through the PMD layer 120 as in the first embodiment, a metal barrier layer 190 is deposited directly lining the contact hole 130 and the PMD layer 120. Then, a copper or copper alloy layer 200 is formed on the metal barrier layer 190, substantially filling the contact hole 130. Then, the metal barrier layer 190 and the copper or copper alloy layer 200 are polished or etched back until the PMD layer 120 is exposed and thus a copper or copper alloy plug is formed. The use of copper or copper ally plug in the substrate level contact hole is especially advantageous in reducing contact resistance when the contact hole has a width not exceeding 650 Å, or an aspect ratio not less than 5.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A damascene structure at semiconductor substrate level, comprising:
 a semiconductor substrate with a contact region on the surface;
 a pre-metal dielectric layer comprising a low dielectric constant material with a dielectric constant not exceeding 3.5 on the semiconductor substrate with an opening exposing the contact region;
 a buffer metal layer on the exposed contact region;
 a barrier layer on the interior of the opening; and
 a conductor on the buffer metal layer, substantially filling the opening.

2. The damascene structure as claimed in claim 1, wherein the pre-metal dielectric layer comprises a silicon-containing layer or organic-based material.

3. The damascene structure as claimed in claim 1, wherein the pre-metal dielectric layer comprises a stacked SiON/SiN or SiN/SiON layer lining the substrate as a bi-layer etch stop layer.

4. The damascene structure as claimed in claim 1, wherein the aspect ratio of the opening is not less than 5.

5. The damascene structure as claimed in claim 1, wherein the opening is a single damascene opening.

6. The damascene structure as claimed in claim 1, wherein the opening is a dual damascene opening.

7. The damascene structure as claimed in claim 1, wherein the buffer metal layer comprises amorphous metal.

8. The damascene structure as claimed in claim 1, wherein the buffer metal layer comprises refractory metal.

9. The damascene structure as claimed in claim 1, wherein the buffer metal layer is formed by deposition of a metal layer followed by etch back.

10. The damascene structure as claimed in claim 1, wherein the buffer metal layer is formed by a selective epitaxial growth process.

11. The damascene structure as claimed in claim 1, wherein the buffer metal layer is formed by directional sputtering.

12. The damascene structure as claimed in claim 1, wherein the thickness of the buffer metal layer is less than 1/5 of the opening depth.

13. The damascene structure as claimed in claim 1, wherein the thickness of the buffer metal layer is about 100–500 Å.

14. The damascene structure as claimed in claim 1, wherein the baffler layer is a dielectric barrier layer.

15. The damascene structure as claimed in claim 14, wherein the dielectric barrier layer is on the sidewall of the opening.

16. The damascene structure as claimed in claim 14, wherein the dielectric barrier layer comprises a silicon-containing layer.

17. The damascene structure as claimed in claim 14, wherein the width of the dielectric barrier layer is between about 30 and 300 Å.

18. The damascene structure as claimed in claim 14, wherein the dielectric barrier layer is formed by deposition of a substantially conformal dielectric layer followed by anisotropic etch back.

19. The damascene structure as claimed in claim 1, wherein the barrier layer is a metal barrier layer.

20. The damascene structure as claimed in claim 19, wherein the metal barrier layer comprises a nitrogen-containing metal layer.

21. The damascene structure as claimed in claim 19, wherein the metal barrier layer comprises tantalum, titanium, tungsten, tantalum nitride, titanium nitride, tungsten nitride, or combinations thereof.

22. The damascene structure as claimed in claim 19, wherein the thickness of the metal barrier layer is between about 10 and 150 Å.

23. The damascene structure as claimed in claim 19, wherein the metal barrier layer is formed by chemical vapor deposition (CVD) followed by thermal annealing, or formed by physical vapor deposition (PVD).

24. The damascene structure as claimed in claim 19, wherein the metal barrier layer is a dual-layer CVD film.

25. The damascene structure as claimed in claim 19, wherein the metal barrier layer is amorphous metal or polycrystalline metal.

26. The damascene structure as claimed in claim 1, wherein the conductor is a metal, metal compound, or metal alloy.

27. The damascene structure as claimed in claim 1, wherein the conductor comprises a copper or copper alloy plug.

28. The damascene structure as claimed in claim 27, wherein the conductor further comprises a copper or copper alloy interconnect.

29. A damascene structure at semiconductor substrate level, comprising:
   a semiconductor substrate with a source/drain region of a MOS transistor and a metal silicide formed on the source/drain region;
   a pre-metal dielectric layer comprising a low dielectric constant material with a dielectric constant not exceeding 3.5 on the semiconductor substrate with a contact hole exposing the metal silicide, the width of the contact hole not exceeding 650 Å;
   a metal barrier layer on the bottom and sidewalls of the contact hole; and
   a copper or copper alloy plug on the metal barrier layer, substantially filling the contact hole.

30. The damascene structure as claimed in claim 29, wherein the semiconductor substrate is a silicon substrate or silicon-on-insulator (SOI) substrate.

31. The damascene structure as claimed in claim 29, wherein the metal silicide is titanium silicide, cobalt silicide, nickel silicide, or combinations thereof.

32. The damascene structure as claimed in claim 29, wherein the pre-metal dielectric layer comprises a silicon-containing layer or organic-based material.

33. The damascene structure as claimed in claim 29, wherein the silicon-containing layer comprises silicon carbide, silicon oxide, silicon nitride, silicon oxynitride, silicon-rich oxide, silicon-rich oxynitride, carbon-doped silicon oxide, carbon-doped silicon nitride, carbon/nitrogen-doped silicon oxide, or combinations thereof.

34. The damascene structure as claimed in claim 29, wherein the pre-metal dielectric layer comprises a stacked SiON/SiN or SiN/SiON layer lining the substrate as a bi-layer etch stop layer.

35. The damascene structure as claimed in claim 29, wherein the pre-metal dielectric layer comprises a silicon-rich oxynitride layer lining the substrate as an etch stop layer.

36. The damascene structure as claimed in claim 29, wherein the pre-metal dielectric layer comprises a silicon oxynitride layer formed by plasma-enhanced chemical vapor deposition (PE-CVD) lining the substrate as an etch stop layer.

37. The damascene structure as claimed in claim 29, wherein the aspect ratio of the contact hole is at least 5.

38. The damascene structure as claimed in claim 29, wherein the contact hole has a depth not exceeding 5000 Å.

39. The damascene structure as claimed in claim 29, wherein the metal barrier layer comprises a nitrogen-containing metal layer.

40. The damascene structure as claimed in claim 29, wherein the metal barrier layer comprises tantalum, titanium, tungsten, tantalum nitride, titanium nitride, tungsten nitride, or combinations thereof.

41. The damascene structure as claimed in claim 29, wherein the thickness of the metal barrier layer is between about 10 and 150 Å.

42. The damascene structure as claimed in claim 29, wherein the metal barrier layer is formed by chemical vapor deposition (CVD) followed by thermal annealing, or formed by physical vapor deposition (PVD).

43. The damascene structure as claimed in claim 29, wherein the metal barrier layer is a dual-layer CVD film.

44. The damascene structure as claimed in claim 29, wherein the metal barrier layer is a dual-layer TiN/TiN film formed by depositing a first CVD TiN film and annealing the same, and depositing a second CVD TiN film.

45. The damascene structure as claimed in claim 29, wherein the metal barrier layer is amorphous metal or polycrystalline metal.

* * * * *